(12) United States Patent
Yokoi et al.

(10) Patent No.: US 6,586,145 B2
(45) Date of Patent: Jul. 1, 2003

(54) METHOD OF FABRICATING SEMICONDUCTOR DEVICE AND SEMICONDUCTOR DEVICE

(75) Inventors: Naoki Yokoi, Hyogo (JP); Hiroshi Tanaka, Hyogo (JP); Yasuhiro Asaoka, Hyogo (JP); Seiji Muranaka, Hyogo (JP); Toshihiko Nagai, Osaka (JP)

(73) Assignees: Mitsubishi Denki Kabushiki Kaisha, Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/073,189

(22) Filed: Feb. 13, 2002

(65) Prior Publication Data
US 2003/0003754 A1 Jan. 2, 2003

(30) Foreign Application Priority Data

Jun. 29, 2001 (JP) ......................... 2001-198971

(51) Int. Cl.$^7$ ............................. G03F 9/00; H01L 2/302
(52) U.S. Cl. ........................ 430/5; 438/725; 438/717; 438/714; 438/704; 438/750; 134/1.2; 134/1.3
(58) Field of Search ................ 430/5; 134/1.2, 134/1.3; 438/725, 717, 714, 704, 723, 724, 734, 736, 743, 744, 750

(56) References Cited

U.S. PATENT DOCUMENTS

| 5,821,169 A | * 10/1998 | Nguyen et al. ............. 438/736 |
| 6,001,734 A | * 12/1999 | Drynan ....................... 438/637 |
| 6,020,111 A | * 2/2000 | Mihara ........................ 430/318 |
| 2001/0038972 A1 | * 11/2001 | Lyons et al. ................ 430/313 |
| 2001/0041444 A1 | * 11/2001 | Shields et al. .............. 438/689 |

FOREIGN PATENT DOCUMENTS

| JP | 4-314334 | 11/1992 |
| JP | 11-68095 | 3/1999 |
| JP | 2000-100792 | 4/2000 |

* cited by examiner

*Primary Examiner*—George Goudreau
(74) *Attorney, Agent, or Firm*—McDermott, Will & Emery (57) ABSTRACT

A method of fabricating a semiconductor device causing no pattern shifting of a peripheral oxide film etc. in removal of both of an antireflection film and a mask pattern and having a fine structure not implementable solely by photolithography and the semiconductor device are obtained. The method of fabricating a semiconductor device comprises steps of forming a base film of either a silicon film or a silicon compound film on a semiconductor substrate, forming a hard film of either a metal film or a metal compound film on the base film, forming a resist pattern on the hard film, dryly etching the hard film through the resist pattern serving as a mask for forming a hard pattern, dryly etching the base film through the hard pattern serving as a mask and removing the hard pattern by wet etching with a chemical solution not etching at least the base film.

10 Claims, 10 Drawing Sheets

METHOD OF FABRICATING SEMICONDUCTOR DEVICE AND SEMICONDUCTOR DEVICE

BACKGROUND OF THE INVENTION

1. Field of the Invention

The present invention relates to a method of fabricating a semiconductor device and a semiconductor device, and more specifically, it relates to a method of fabricating a semiconductor device capable of forming a precision fine pattern not implementable solely by photolithography and a semiconductor device.

2. Description of the Prior Art

Following improvement in the degree of integration of a semiconductor device such as a DRAM (dynamic random access memory), a fine pattern having a size smaller than the wavelength of a light source employed for photolithography must be formed on a semiconductor substrate. Such a fine pattern can be formed by a method of preparing a gate electrode from polycrystalline silicon (hereinafter referred to as polysilicon).

Figure 23:
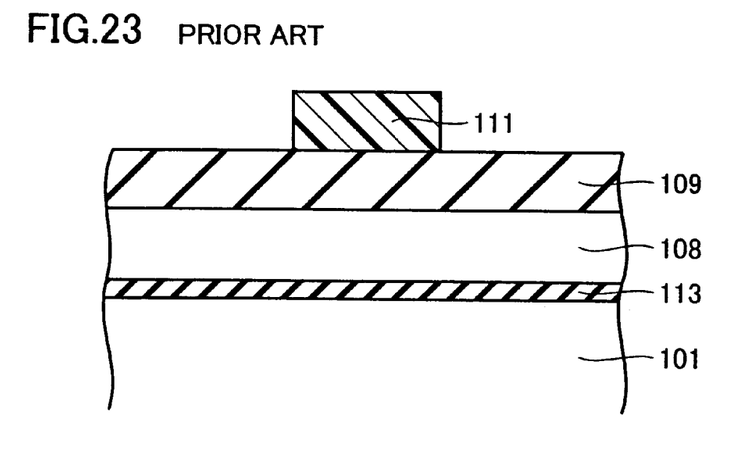
FIG. 23 is a sectional view showing a stage of forming a photoresist pattern on a gate insulator film, a polysilicon film and a silicon oxide film in formation of a gate electrode in a conventional method of fabricating a MOS transistor.
Figure 24:
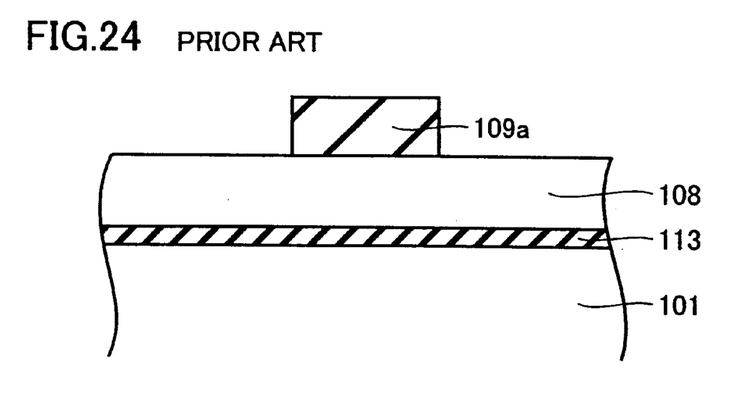
FIG. 24 is a sectional view showing a stage of patterning the silicon oxide film shown in FIG. 23 through the photoresist pattern serving as a mask and thereafter removing the photoresist pattern.
Figure 25:
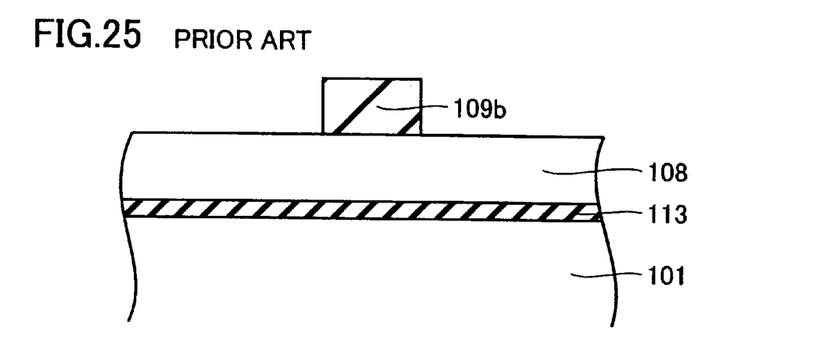
FIG. 25 is a sectional view showing a stage of reducing the width of the silicon oxide film with a chemical solution containing hydrogen peroxide with respect to the state shown in FIG. 24.
Figure 26:
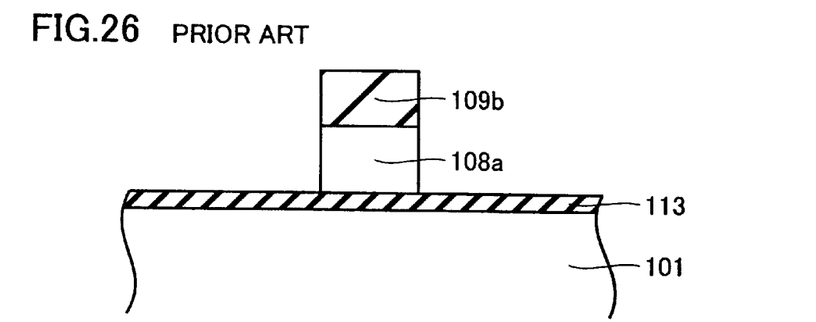
FIG. 26 is a sectional view showing a stage of patterning the polysilicon film through the pattern of the silicon oxide film reduced in width shown in FIG. 25 serving as a mask.

This method is now described with reference to FIGS. 23 to 27. Referring to FIG. 23, a gate insulator film 113 is formed on a silicon substrate 101, and a polysilicon film 108 is deposited thereon. A silicon oxide film 109 is arranged on the polysilicon film 108, and a photoresist pattern 111 is formed thereon. This photoresist pattern 111 is employed as a mask for dryly etching the silicon oxide film 109 as shown in FIG. 24. A pattern 109a obtained from the silicon oxide film 109 is dipped in a chemical solution containing hydrofluoric acid, to be thinned. In other words, the width of the pattern 109a is narrowed for obtaining a precision-made pattern 109b (FIG. 25). Thereafter the precision-made pattern 109b is employed as a mask for dryly etching the polysilicon film 108. Consequently, a polysilicon pattern 108a for defining a gate electrode is obtained (FIG. 26).

Figure 27:
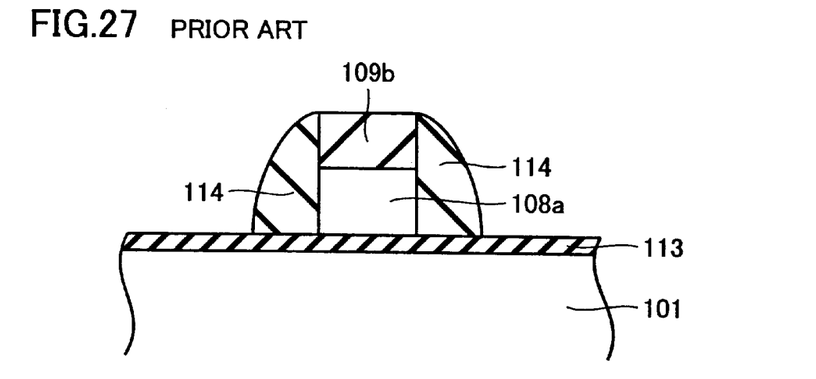
FIG. 27 is a sectional view showing a stage of forming silicon oxide films thereby defining side wall spacers with respect to the state shown in FIG. 26.

Silicon oxide films are deposited on the aforementioned polysilicon pattern 108a for forming side wall spacers 114. Consequently, a gate electrode having a small width can be formed (FIG. 27).

In order to deposit cobalt on the polysilicon pattern 108a for forming an electrode of cobalt silicide through a salicide process, however, the silicon oxide film 109b employed as the mask must be removed with hydrofluoric acid or the like. When the silicon oxide film 109b is removed with hydrofluoric acid or the like, however, the gate oxide film 113 and the patterns of the silicon oxide films such as the side wall spacers 114 around the gate electrode are also etched at the same time. Such etching is disadvantageous. Thus, awaited is a method of forming a fine pattern not implementable solely by photolithography with no pattern shifting etching unnecessary portions or the like.

Figure 28:
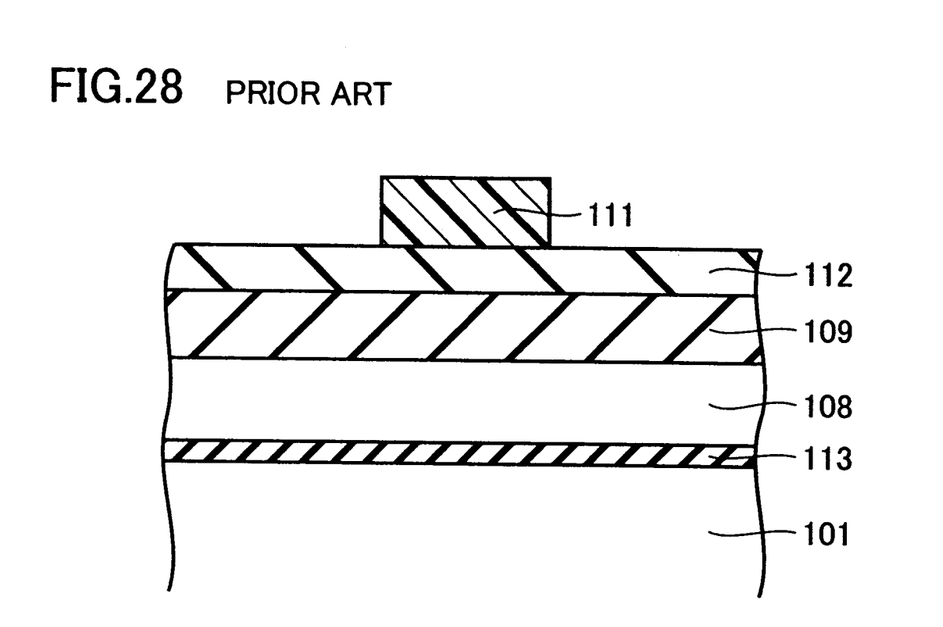
FIG. 28 is a sectional view showing a silicon oxynitride film serving as an antireflection film in formation of the photoresist pattern in the conventional method of fabricating a MOS transistor.

When a MOS transistor is fabricated in practice, a silicon oxynitride film 112 may be deposited between the silicon oxide film 109 and the photoresist pattern 111 as an antireflection film for photolithography, as shown in FIG. 28. In order to etch the polysilicon film 108 through the pattern 109b of the silicon oxide film 109 thinned by wet etching, this antireflection film 112 must be removed before the wet etching. If the antireflection film 112 is removed by wet etching employing phosphoric acid or the like, however, the silicon oxide film 109 for forming the mask 109b is also etched. Therefore, the size of the finally obtained polysilicon pattern 108a disadvantageously fluctuates.

Further, the pattern 109b of the silicon oxide film 109 employed as the mask for dry etching as described above must be finally removed. However, a chemical solution employed for removing the pattern 109b of the silicon oxide film 109 by wet etching inevitably etches the remaining silicon oxide films forming the peripheral portions and the silicon oxynitride film 112. When the mask pattern 109b of the silicon oxide film 109 is removed, therefore, the gate electrode and a portion around a contact hole are also etched to deteriorate dimensional accuracy.

SUMMARY OF THE INVENTION

An object of the present invention is to provide a method of fabricating a semiconductor device having a fine structure not implementable solely by photolithography with no pattern shifting on a peripheral oxide film or when removing an antireflection film as well as a mask pattern, and the semiconductor device.

The method of fabricating a semiconductor device according to the present invention comprises steps of forming a base film of either a silicon film or a silicon compound film on a semiconductor substrate and forming a hard film of either a metal film or a metal compound film in contact with the upper portion of the base film. The method also comprises steps of forming a photoresist pattern in contact with the upper portion of the hard film and dryly etching the hard film through the photoresist pattern serving as a mask for forming a hard pattern. The method further comprises steps of dryly etching the base film through the hard pattern serving as a mask and removing the hard pattern by wet etching with a chemical solution not substantially etching at least the base film.

According to this structure, the hard film is formed by a metal-based film, and the base film is formed by a film mainly composed of silicon. In the step of removing the hard pattern by wet etching, therefore, the chemical not etching the pattern of the base film can be selected with no significant difficulty. The above wording "chemical solution not substantially etching at least the base film (but etching the hard film)" stands for a chemical solution having large etch selectivity for the hard film with respect to the base film. When the base film is formed by a polysilicon film and the hard film is formed by a metal film of tungsten or the like, for example, a chemical solution containing an oxidant such as hydrogen peroxide water or ozone water corresponds to this chemical solution.

Thus, the pattern of the base film formed by dry etching is not influenced by the aforementioned chemical solution. Therefore, neither a gate electrode nor a contact hole causes pattern shifting in the aforementioned wet etching for removing the hard pattern. Thus, a semiconductor device having a fine precision structure can be obtained. Consequently, the semiconductor device having a fine structure can be fabricated with an excellent yield. The base film may be in contact with the upper portion of the semiconductor substrate, or may be formed on another film interposed between the same and the semiconductor substrate.

The aforementioned method of fabricating a semiconductor device according to the present invention further comprises a step of wetly etching the hard pattern with a chemical solution substantially not etching at least the base film for forming a precision-made hard pattern between the step of forming the hard pattern and the step of dryly etching the base film. In the step of dryly etching the base film, the base film can be dryly etched through the precision-made hard pattern serving as a mask.

According to this structure, a precision hard pattern not implementable solely by photolithography can be obtained without exerting bad influence such as pattern shifting on at least the base film or the remaining portions. Further, the hard pattern can be removed without exerting bad influence on at least the base film or the remaining portions as hereinabove described.

When this precision-made hard pattern is employed, a fine gate electrode and a precision contact hole can be formed in a refined MOS transistor.

The aforementioned method of fabricating a semiconductor device according to the present invention further comprise a step of removing the photoresist pattern after the step of forming the hard pattern by dry etching.

When the base film is dryly etched through the mask of the aforementioned hard pattern, the photoresist pattern may remain in contact with the upper portion of the hard film. However, precision may be more readily improved if the photoresist pattern is removed. Therefore, the photoresist pattern is preferably removed by ashing or the like before the step of etching the base film through the mask of the hard pattern. When the hard pattern is wetly etched for forming the precision-made hard pattern, the aforementioned photoresist pattern is removed by ashing or the like generally before the step of forming the precision-made hard pattern.

In the aforementioned method of fabricating a semiconductor device according to the present invention, processing is performed while leaving the photoresist pattern intact after the step of forming the hard pattern by dry etching. In the step of removing the hard pattern, the photoresist pattern can be removed by wet etching along with the hard pattern.

According to this structure, the base film can be dryly etched through the mask of the hard pattern while leaving the photoresist pattern intact. In this case, the hard pattern may be improved in precision by wet etching while holding the photoresist pattern. In the method of fabricating a semiconductor device according to the present invention, the hard pattern is wetly etched while leaving the photoresist pattern located in contact with the upper portion thereof intact in the wet etching step for improving the precision of the hard pattern. The precision-made hard pattern having the photoresist pattern located thereon is employed as a mask for dryly etching the base film. Then, the photoresist pattern can be removed by wet etching along with the (precision-made) hard pattern in the step of removing the hard pattern.

The chemical solution employed for wetly etching the aforementioned hard pattern generally also etches the photoresist pattern. Thus, the photoresist pattern is also wetly etched along with the hard pattern in the wet etching step for forming the aforementioned precision-made hard pattern. Also when the photoresist pattern is held, therefore, the hard pattern can be improved in precision with no problem. When the hard pattern and the photoresist pattern are removed, the chemical solution does not etch at least a peripheral portion such as the base film to result in pattern shifting, as described above. Thus, a semiconductor device having a fine structure and excellent dimensional accuracy can be obtained.

In the aforementioned method of fabricating a semiconductor device according to the present invention, the hard film can consist of a film containing at least one of titanium, titanium nitride, tungsten and tungsten nitride.

When the hard film is prepared from titanium, tungsten or a compound thereof as described above, a readily purchased raw material having excellent circulativity can be employed as a proper mask material for dry etching. Further, a chemical solution having large selectivity with respect to the hard film and the base film can be extremely readily selected in wet etching.

In the aforementioned method of fabricating a semiconductor device according to the present invention, the base film can be any of a silicon film, a silicon oxide film, a silicon nitride film, a silicon oxynitride film and a metal silicide film.

The aforementioned material for the base film, facilitating film formation or the like when the semiconductor device is formed on a silicon substrate, is extremely frequently employed for fabricating a semiconductor device of silicon. When the hard film is formed by a metal film and the base film is made of the aforementioned material, the semiconductor device can be efficiently fabricated at a low cost without employing an extremely specific chemical solution. Further, heterogeneity of etched tendencies of the metal film and the aforementioned base film can be increased with a relatively general chemical solution, whereby the range for selecting an etching solution having large selectivity can be widened. The silicon film may contain a p-conductivity type or n-conductivity type impurity, and a polysilicon film, an amorphous silicon film or an epitaxial silicon film (single-crystalline silicon film) corresponds thereto. CoSi, TiSi, WSi or the like corresponds to the metal silicide in chemical formula expression.

In the aforementioned method of fabricating a semiconductor device according to the present invention, a chemical solution containing an oxidant can be employed in at least either the step of removing the hard pattern by wet etching or the step of forming the precision-made hard pattern by wet etching.

In the aforementioned method of fabricating a semiconductor device according to the present invention, a chemical solution containing acid can be employed in at least either the step of removing the hard pattern by wet etching or the step of forming the precision-made hard pattern by wet etching.

Alternatively, a chemical solution containing ammonia can be employed in at least either the step of removing the hard pattern by wet etching or the step of forming the precision-made hard pattern by wet etching.

When the semiconductor substrate is formed by a silicon substrate, it is highly probable that the material for the base film is a polysilicon film or a silicon oxide film mainly composed of silicon as described above. In the point of the aforementioned high etch selectivity, the metal film is utterly different from the aforementioned material for the base film. An etching solution having a high etch rate for the metal film and a low etch rate for silicon or the like may be prepared from a chemical solution containing an oxidant, a chemical solution containing acid or a chemical solution containing ammonia. The oxidant may be prepared from hydrogen peroxide water or ozone water, for example.

Such a chemical solution is properly selected in response to the type of the metal forming the hard film. For example, ammonia is relatively properly employed when the hard film is made of tungsten or tungsten nitride, hydrofluoric acid is relatively preferably employed when the hard film is made of titanium or titanium nitride.

A precision fine pattern not implementable by photolithography can be obtained under prescribed conditions by employing the aforementioned chemical solution containing an oxidant, acid or ammonia.

In the aforementioned method of fabricating a semiconductor device according to the present invention, the hard pattern can be removed with at least one of a chemical solution containing hydrogen peroxide, a chemical solution containing ozone water, a chemical solution containing sulfuric acid, a chemical solution containing hydrochloric acid, a chemical solution containing phosphoric acid, a chemical solution containing nitric acid, a chemical solution containing acetic acid, a chemical solution containing hydrofluoric acid and a chemical solution containing ammonia in the step of removing the hard pattern by wet etching.

Each of the aforementioned chemical solutions has large etch selectivity with respect to a metal film or a metal compound film of Ti, W, TiN or WN, a silicon film, a silicon oxide film, a silicon nitride film and a metal silicide film. In the step of removing the hard pattern or the precision-made hard pattern, therefore, the hard pattern can be removed without substantially etching the base film. Also when the hard pattern or the precision-made hard pattern has a photoresist pattern, the hard pattern is removed along with the photoresist pattern, not to exert bad influence on other portions.

In the aforementioned method of fabricating a semiconductor device according to the present invention, the hard pattern can be removed with at least one of a chemical solution containing hydrogen peroxide, a chemical solution containing ozone water, a chemical solution containing sulfuric acid, a chemical solution containing hydrochloric acid, a chemical solution containing phosphoric acid, a chemical solution containing nitric acid, a chemical solution containing acetic acid, a chemical solution containing hydrofluoric acid and a chemical solution containing ammonia in the step of wetly etching the hard pattern for forming the precision-made hard pattern.

A semiconductor device according to the present invention, formed on a semiconductor substrate, is fabricated by the aforementioned method of fabricating a semiconductor device.

According to this structure, the inventive semiconductor device can have a precision fine pattern. Thus, the yield is so improved that a semiconductor device having high reliability can be obtained at a low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
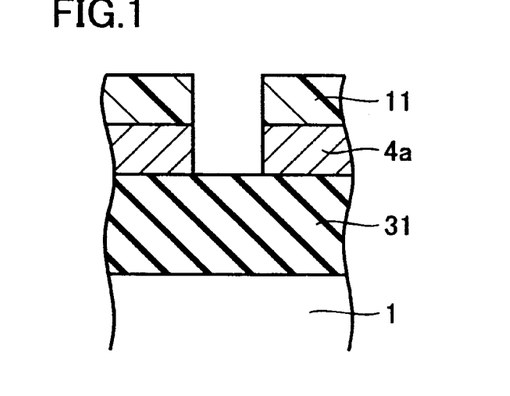
FIG. 1 is a sectional view showing a stage of obtaining a hard mask pattern through a mask of a resist pattern in a method of fabricating a semiconductor device according to a first embodiment of the present invention.
Figure 2:
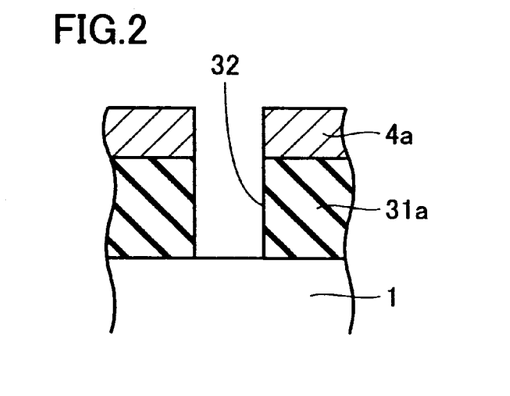
FIG. 2 is a sectional view showing a stage of dryly etching an interlayer film through the hard mask after removing the resist pattern from the state shown in FIG. 1.
Figure 3:
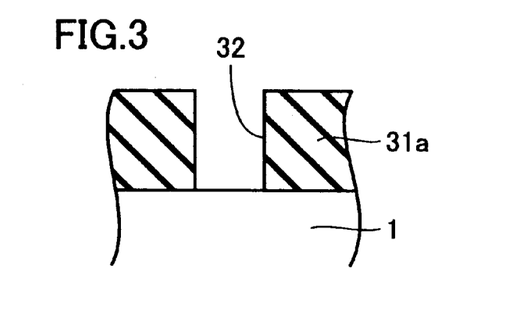
FIG. 3 is a sectional view showing a stage of removing the hard mask from the state shown in FIG. 2.

FIGS. 1 to 3 are sectional views illustrating a method of fabricating a semiconductor device according to a first embodiment of the present invention. Referring to FIG. 1, a silicon oxide film (base film) 31 serving as an interlayer film is formed on a silicon substrate 1 in contact with the upper portion thereof. A pattern (hard pattern) 4a of a film consisting of at least one of tungsten, tungsten nitride, titanium and titanium nitride is arranged on the silicon oxide film 31. This hard pattern 4a is formed by dry etching through a resist pattern 11 serving as a mask.

Thereafter the resist pattern 11 is removed by ashing. Then, the silicon oxide film 31a is dryly etched through the hard pattern 4a serving as a mask thereby forming a contact hole 32, as shown in FIG. 2. Finally, the hard pattern 4a is removed with a chemical solution containing hydrogen peroxide. The concentration of hydrogen peroxide, depending on the etching time, is generally in the range of 0.03 to 30%, more preferably about 0.1 to 10%. The chemical solution may contain ammonia, hydrochloric acid, sulfuric acid, phosphoric acid, nitric acid, acetic acid or the like in addition to hydrogen peroxide. The chemical solution is used in the temperature range of the room temperature up to 150° C. The hard pattern 4a can alternatively be removed with sulfuric acid containing no hydrogen peroxide when the same is made of Ti or TiN.

The etching time, adjustable in response to the composition, the concentration and the temperature of the chemical solution, mainly depends on an apparatus employed for the etching. The etching time is generally 30 seconds to two minutes for a single wafer processing apparatus or about 3 to 15 minutes for a batch processing apparatus.

Referring to FIG. 3, the aforementioned concentration range, temperature, etching time and additional component are employed for the chemical solution containing hydrogen peroxide employed for removing the hard pattern 4a. This chemical solution is so employed that only the hard pattern 4a can be etched without substantially etching the silicon oxide film 31 and the silicon substrate 1. The chemical solution containing hydrogen peroxide has a large etch rate for the aforementioned tungsten or the like while exhibiting an extremely small, substantially ignorable etch rate for the silicon oxide film 31 and silicon. In other words, the aforementioned chemical solution containing hydrogen peroxide is an etching solution having large etch selectivity. Therefore, the contact hole 32 causes no pattern shifting when the hard mask 4a is removed. Therefore, a fine pattern having high dimensional accuracy and positional accuracy can be obtained. Consequently, a semiconductor device having a fine structure can be efficiently fabricated with a high yield.

Second Embodiment

Figure 4:
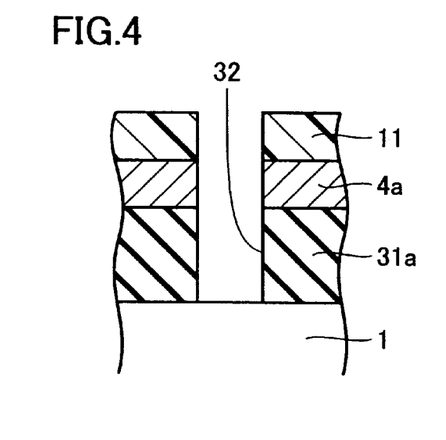
FIG. 4 is a sectional view showing a stage of dryly etching an interlayer film through a hard mask while holding a resist pattern in a method of fabricating a semiconductor device according to a second embodiment of the present invention.
Figure 5:
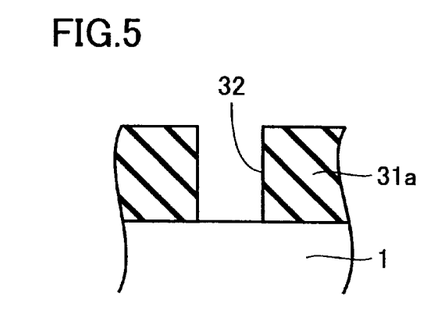
FIG. 5 is a sectional view showing a stage of removing both of the resist pattern and the hard mask from the state shown in FIG. 4.

FIGS. 4 and 5 are sectional views illustrating a method of fabricating a semiconductor device according to a second embodiment of the present invention. The initial step of the method according to the second embodiment is identical to that shown in FIG. 1. Referring to FIG. 1, a silicon oxide film (base film) 31 serving as an interlayer film is formed on a silicon substrate 1 in contact with the upper portion thereof. A hard pattern 4a of a film consisting of at least one of tungsten, tungsten nitride, titanium and titanium nitride is arranged on the silicon oxide film 31.

The resist pattern 11, removed by ashing after the step shown in FIG. 1 in the first embodiment, is not removed but held as such according to the second embodiment. Then, the silicon oxide film 31 is dryly etched through the hard pattern 4a and the resist pattern 11 serving as masks for forming a contact hole 32, as shown in FIG. 4. Finally, the hard pattern 4a and the resist pattern 11 are removed with a chemical solution containing hydrogen peroxide, as shown in FIG. 5.

When sulfuric acid is employed, the concentration thereof is set to 1 to 98%. The chemical solution may contain hydrogen peroxide, in addition to sulfuric acid. The chemical solution prepared from sulfuric acid is employed in the temperature range of the room temperature up to 150° C. The etching time is similar to the aforementioned one for the chemical solution containing hydrogen peroxide. More specifically, the aforementioned chemical solution containing hydrogen peroxide in addition to sulfuric acid is prepared from a mixed solution of sulfuric acid and hydrogen peroxide water. In general, the mixed solution contains sulfuric acid and hydrogen peroxide water in the ratio of 5:1 to 50:1, and is employed at a temperature of 100 to 150° C. The mixed solution of sulfuric acid and hydrogen peroxide water may be combined with a mixed solution of ammonia water, hydrogen peroxide water and water.

Referring to FIG. 5, the chemical solution containing hydrogen peroxide or the like removing the hard pattern 4a etches only the hard pattern 4a and the resist pattern 11, without substantially etching the silicon oxide film 31 and the silicon substrate 1. In other words, the chemical solution containing hydrogen peroxide has a large etch rate for the aforementioned tungsten and the resist pattern 11. However, the chemical solution exhibits an extremely small, substantially ignorable etch rate for the silicon oxide film 31 and silicon. In other words, the aforementioned chemical solution is an etching solution having large selectivity. Therefore, the contact hole 32 causes no pattern shifting when the hard pattern 4a and the resist pattern 11 are removed. Consequently, a fine pattern having high dimensional accuracy and positional accuracy can be obtained.

Third Embodiment

FIGS. 6 to 14 are diagrams for illustrating a method of fabricating a semiconductor device according to a third embodiment of the present invention. A method of forming a gate electrode of a MOS transistor according to the third embodiment is now described with reference to FIGS. 6 to 14.

Figure 6:
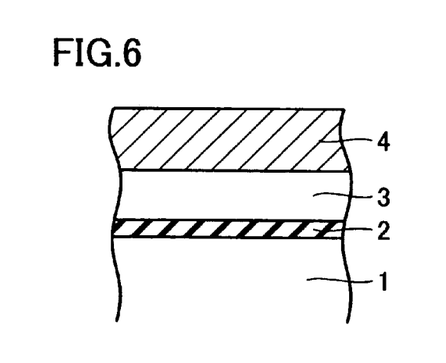
FIG. 6 is a sectional view showing a stage of forming a polysilicon film for defining a gate electrode on a gate insulator film and depositing a tungsten film in a method of fabricating a gate electrode of a MOS transistor according to a third embodiment of the present invention.
Figure 7:
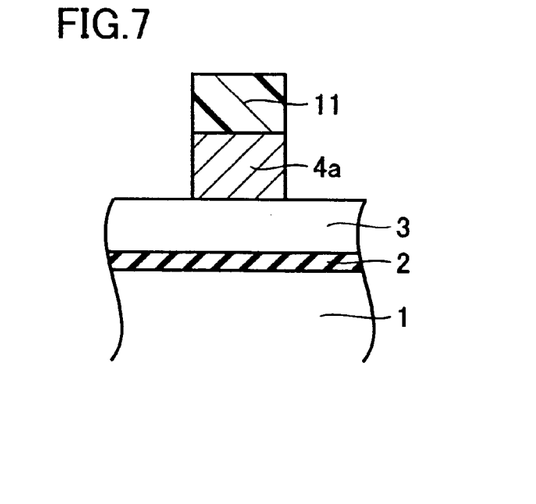
FIG. 7 is a sectional view showing a stage of forming a photoresist pattern on the tungsten film shown in FIG. 6 and obtaining a pattern of the tungsten film by dry etching through the photoresist pattern serving as a mask.

First, a gate insulator film 2 is formed on the surface of a silicon substrate 1, and a polysilicon film 3 is deposited on the gate insulator film 2 by CVD (chemical vapor deposition) or the like. Further, a tungsten film 4 is deposited on the polysilicon film 3 by CVD or the like (FIG. 6). Then, the tungsten film 4 is patterned by dry etching through a photoresist pattern 11, formed on the tungsten film 4 by photolithography, serving as a mask (FIG. 7).

Figure 8:
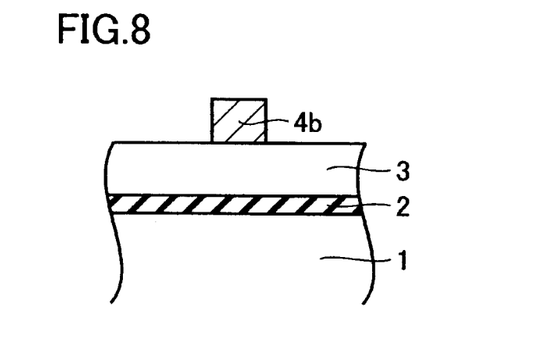
FIG. 8 is a sectional view showing a stage of removing the photoresist pattern shown in FIG. 7 and partially etching the tungsten pattern with a chemical containing hydrogen peroxide for reducing the width thereof.

Then, the photoresist pattern 11 is removed by ashing or the like. Then, the patterned tungsten film 4a is partially etched with a chemical solution containing hydrogen peroxide, to be thinned (FIG. 8). The thinned tungsten film 4b includes a fine pattern undrawable by photolithography.

Figure 9:
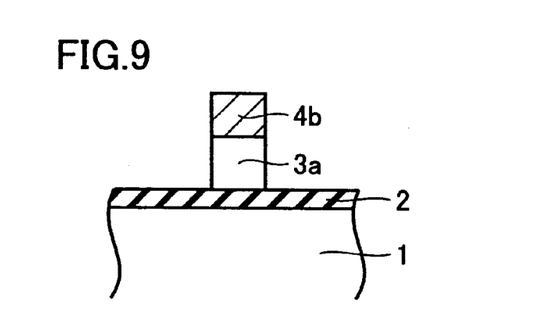
FIG. 9 is a sectional view showing a stage of etching the polysilicon film through the tungsten pattern shown in FIG. 8 serving as a mask for obtaining a polysilicon pattern.
Figure 10:
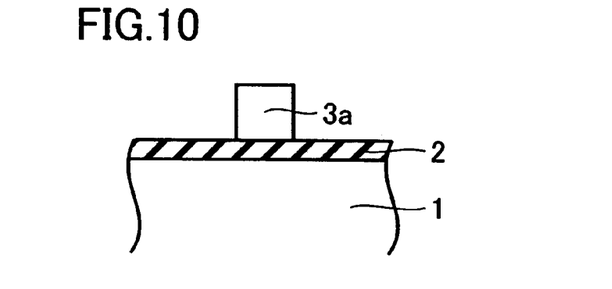
FIG. 10 is a sectional view showing a stage of wetly etching the substance shown in FIG. 9 with a chemical solution containing an oxidant thereby removing the tungsten pattern.

Then, the tungsten film 4b thinned with the chemical solution is employed as a mask for patterning the polysilicon film 3 located under the same by dry etching (FIG. 9). Finally, the tungsten film 4b is removed with a chemical solution containing an oxidant for obtaining a polysilicon pattern 3a (FIG. 10). The chemical solution containing an oxidant preferably contains hydrogen peroxide water or ozone water.

According to the aforementioned method, the pattern of the tungsten film 4b employed as the mask for etching the polysilicon film 3 can be thinned without exerting influence on the peripheral portion of the gate electrode. Therefore, a fine polysilicon can be obtained beyond the limit of photolithography. Further, the tungsten film 4b employed as the mask can be removed without etching and influencing the peripheral portion.

According to the third embodiment, the tungsten film 4b is employed as the mask for etching the polysilicon film 3. Alternatively, the tungsten film 4b can be replaced a film of a compound containing tungsten such as a tungsten nitride film, in order to attain a similar effect. When a film containing titanium such as a titanium film or a titanium nitride film is employed in place of a tungsten film or a tungsten nitride film, a chemical solution containing any one of hydrogen peroxide, hydrofluoric acid and sulfuric acid can be employed for thinning and removing this film. Further alternatively, a multilayer structure formed by a plurality of films containing tungsten or titanium may be employed in place of the tungsten film 4b, in order to attain a similar effect.

Figure 11:
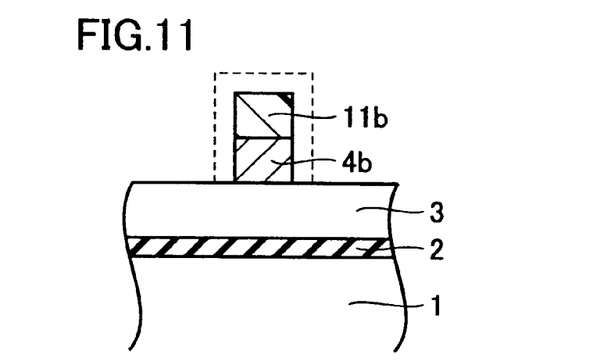
FIG. 11 is a sectional view showing a stage of simultaneously partially wetly etching the polysilicon pattern and the tungsten pattern with a chemical solution containing hydrogen peroxide without removing the tungsten film from the state shown in FIG. 9.
Figure 12:
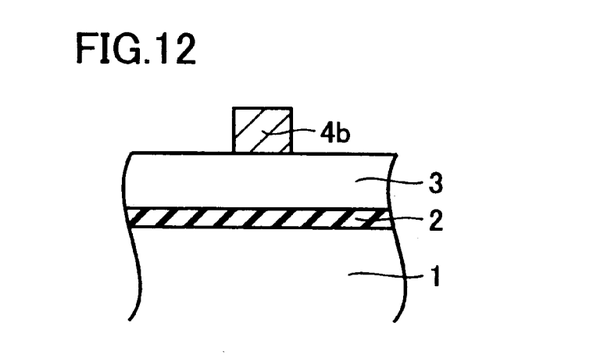
FIG. 12 is a sectional view showing a stage of formation of the tungsten pattern.

According to the third embodiment, the tungsten film 4 is partially etched with the chemical solution containing an oxidant after removing the photoresist pattern 11 thereby thinning the patterned tungsten film 4a, as shown in FIGS. 7 and 8. However, the chemical solution containing an oxidant also has a function of removing photoresist. When the substance shown in FIG. 7 is dipped in the chemical solution containing an oxidant without through the step of removing the photoresist pattern 11, therefore, the photoresist pattern 11 can be removed simultaneously with reduction of the width of the tungsten film 4a by partial etching, as shown in FIGS. 11 and 12.

Figure 13:
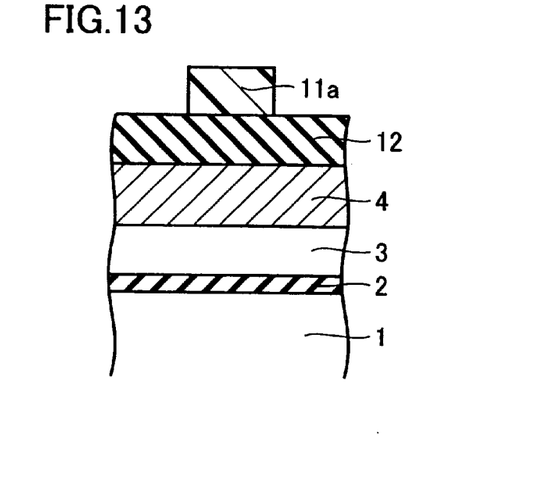
FIG. 13 is a sectional view showing a stage of forming a silicon oxynitride film as an antireflection film for photolithography and patterning a tungsten film through a mask of a photoresist film formed on the antireflection film.
Figure 14:
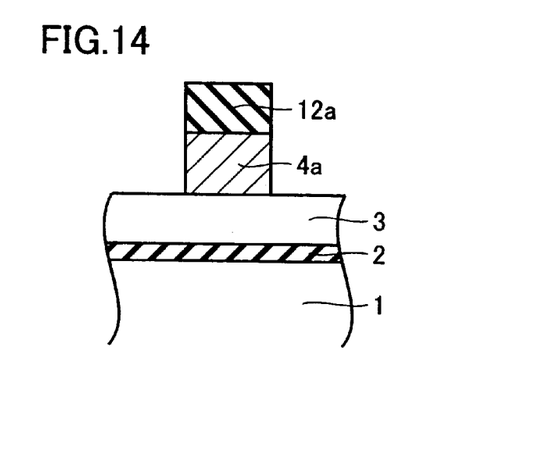
FIG. 14 is a sectional view showing a stage of etching the silicon oxynitride film shown in FIG. 13 with a chemical solution of hydrofluoric acid.

When a silicon oxynitride film 12 is formed between the photoresist pattern 11 and the tungsten film 4 as an antireflection film for photolithography in this embodiment, the silicon oxynitride film 12 may be removed with a chemical solution of hydrofluoric acid or the like after removing the photoresist pattern 11 by ashing, as shown in FIGS. 13 and 14.

Fourth Embodiment

Figure 15:
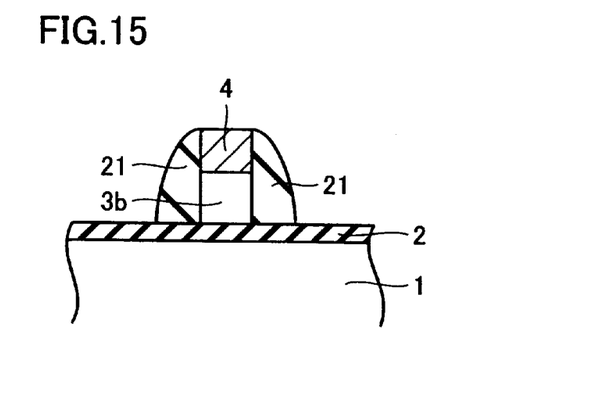
FIG. 15 is a sectional view showing a stage of etching a polysilicon film with a photoresist mask, forming another polysilicon film through a mask pattern of a tungsten film reduced in width with a chemical solution containing hydrogen peroxide and providing side wall spacers in a method of fabricating a gate electrode of a MOS transistor according to a fourth embodiment of the present invention.

FIGS. 15 to 17 are diagrams illustrating a method of fabricating a gate electrode of a MOS transistor according to a fourth embodiment of the present invention. First, a polysilicon film 3 is patterned through a tungsten film 4 reduced in width serving as a mask, through steps similar to those of the third embodiment shown in FIGS. 6 to 9. Consequently, a pattern consisting of a multilayer structure of the tungsten film 4 and the patterned polysilicon film 3a is obtained (FIG. 9). Then, films consisting of silicon oxide or silicon nitride are deposited to cover this pattern. Thereafter side wall spacers 21 are formed by dry etching (FIG. 15).

Figure 16:
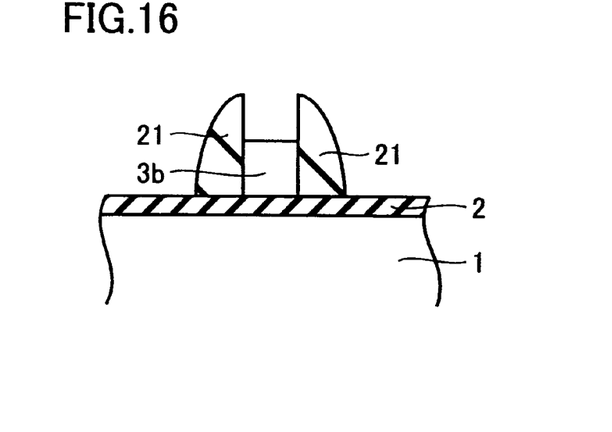
FIG. 16 is a sectional view showing a stage of removing the tungsten film from the state shown in FIG. 15.
Figure 17:
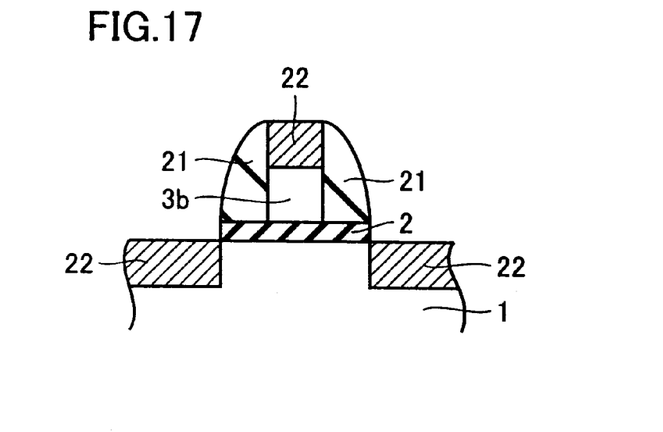
FIG. 17 is a sectional view showing a stage of patterning a gate insulator film and silicifying the upper portion of the gate electrode through a silicide process with respect to the state shown in FIG. 16.

Then, the tungsten film 4 is removed with a chemical solution containing an oxidant, for exposing the polysilicon film 3b as shown in FIG. 16. Finally, a gate electrode is converted to a silicide film 22 of cobalt silicide or the like through a salicide process, as shown in FIG. 17.

Also in this embodiment, the tungsten film 4 can be replaced with a film containing tungsten such as a tungsten nitride film or a film containing titanium such as a titanium film or a titanium nitride film to be partially etched and reduced in width with a chemical solution. Consequently, a fine pattern not implementable by photolithography can be obtained by employing the aforementioned film.

Fifth Embodiment

FIGS. 18 to 22 illustrate a method of forming a contact hole in steps of fabricating a semiconductor device according to a fifth embodiment of the present invention.

Figure 18:
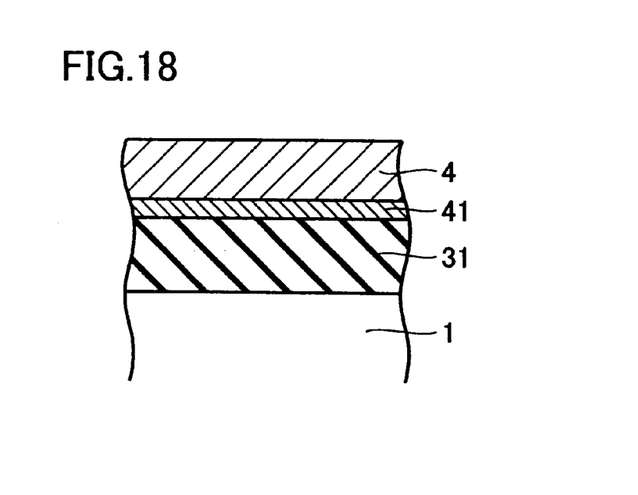
FIG. 18 is a sectional view showing a stage of forming an interlayer film, a barrier metal layer and a tungsten film on a silicon substrate in a method of fabricating a semiconductor device according to a fifth embodiment of the present invention.
Figure 19:
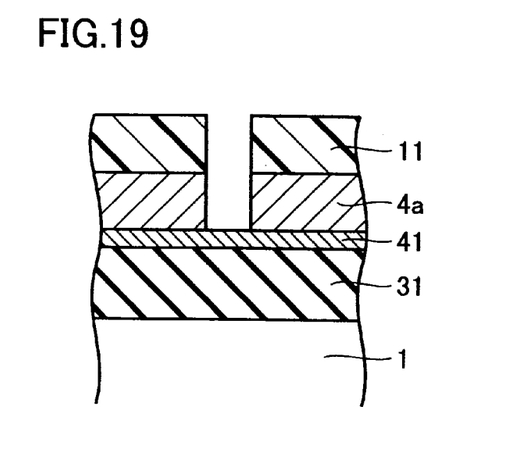
FIG. 19 is a sectional view showing a stage of forming a photoresist pattern having an opening on the substance shown in FIG. 18 and etching the tungsten film through the photoresist pattern serving as a mask.

First, a barrier metal layer 41 of tungsten nitride or titanium nitride is formed by CVD on an interlayer isolation film 31 consisting of silicon oxide or the like deposited on a silicon substrate 1. Then, a tungsten film 4 is formed on the barrier metal layer 41 by CVD (FIG. 18). Then, a photoresist pattern 11 is formed on the tungsten film 4 by photolithography. Thereafter the photoresist pattern 11 is employed as a mask for patterning the tungsten film 4 by dry etching (FIG. 19).

Figure 20:
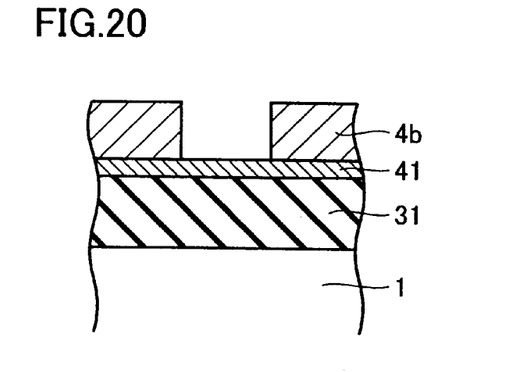
FIG. 20 is a sectional view showing a stage of removing the photoresist pattern from the state shown in FIG. 19 and partially etching the tungsten film with a chemical solution containing hydrogen peroxide for slightly increasing the opening diameter.
Figure 21:
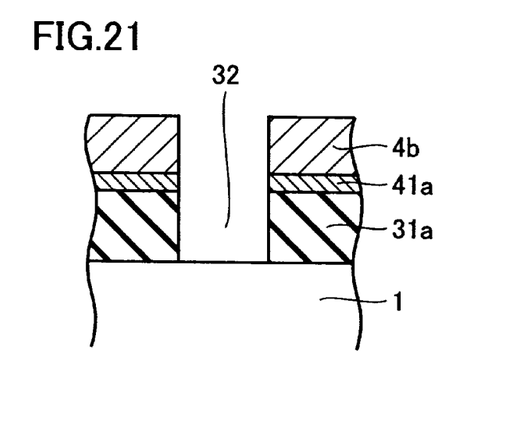
FIG. 21 is a sectional view showing a stage of opening a contact hole through the barrier metal layer and the interlayer film through the pattern of the tungsten film shown in FIG. 20 serving as a mask.
Figure 22:
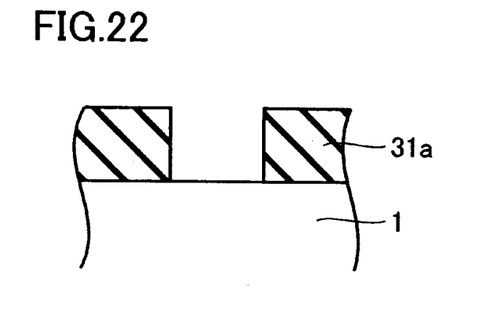
FIG. 22 is a sectional view showing a stage of removing the pattern of the tungsten film and the barrier metal layer from the state shown in FIG. 21.

Then, the photoresist pattern 11 is removed by ashing. Then, the patterned tungsten film 4a is slightly etched with a chemical solution containing hydrogen peroxide, for enlarging the opening diameter as shown in FIG. 20. Then, the tungsten film 4b is employed as a mask for opening a contact hole 32 in the interlayer isolation film 31 by dry etching (FIG. 21). Finally, the tungsten film 4b and the barrier metal layer 41 are removed with a chemical solution containing hydrogen peroxide (FIG. 22).

According to the fifth embodiment, an opening having a dimension of higher accuracy than that resolvable by photolithography can be formed in the interlayer isolation film 31 without influencing the peripheral pattern. Further, the tungsten film 4b employed as the mask can also be removed without influencing the peripheral pattern.

According to this embodiment, the tungsten film 4 is partially etched with the chemical solution containing an oxidant after removing the photoresist pattern 11. However, the chemical solution containing an oxidant also has a function of removing photoresist. When the substance shown in FIG. 19 is dipped in the chemical solution without through the step of removing the photoresist pattern 11, therefore, the photoresist pattern 11 can be removed simultaneously with partial etching of the tungsten film 4.

According to this embodiment, further, the tungsten film 4b is employed as the mask for etching the interlayer isolation film 31. Alternatively, a film of a compound containing tungsten such as a tungsten nitride film may be employed in place of the tungsten film 4b for attaining a similar effect. When a film containing titanium such as a titanium film or a titanium nitride film is employed in place of the tungsten film or the tungsten nitride film, a chemical solution containing any one of hydrogen peroxide, hydrofluoric acid and sulfuric acid can be employed for enlarging the diameter of an opening of the aforementioned film or removing this film. Further alternatively, a multilayer structure formed by a plurality of films containing tungsten or titanium may be employed for attaining an effect similar to the above.

When a silicon oxynitride film is formed between the photoresist pattern 11 and the tungsten film 4 as an antireflection film for photolithography, this silicon oxynitride film may be removed with a chemical solution of phosphoric acid or the like after removing the photoresist pattern 11 by ashing. The silicon oxynitride film may alternatively be removed by dry etching, as a matter of course.

While a contact hole is opened toward the lowermost part of the interlayer isolation film 31 in the fifth embodiment, dry etching may be stopped in an intermediate position of the interlayer isolation film 31. The bottom of the contact hole may be prepared from silicide such as a cobalt silicide, to attain a similar effect.

While the embodiments of the present invention have been described above, these embodiments are merely illustrative and the scope of the present invention is not restricted to these embodiments. For example, the following items are included in the scope of the present invention:

(1) The hard film may be formed by a single metal film, a single metal compound film or a composite metal film prepared by stacking layers of different types of metals.

(2) The base film may be formed by a single film or a multilayer film consisting of a plurality of layers so far as the same is mainly composed of silicon. The base film includes a metal silicide film, in addition to a silicon film, a silicon oxide film and a silicon nitride film.

(3) The base film may or may not contain an n-conductivity type or p-conductivity type impurity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising steps of:
    forming a base film of either a silicon film or a silicon compound film on a semiconductor substrate;
    forming a hard film of either a metal film or a metal compound film in contact with the upper portion of said base film;
    forming a photoresist pattern in contact with the upper portion of said hard film;
    dry etching said hard film through said photoresist pattern serving as a mask for forming a hard pattern;
    wet etching said hard pattern with a chemical solution substantially not etching at least said base film for forming a precision-made hard pattern;
    dry etching said base film through said hard pattern serving as a mask after wet etching said hard pattern; and
    removing said hard pattern by wet etching with a chemical solution not substantially etching at least said base film.

2. The method of fabricating a semiconductor device according to claim 1, further comprising a step of removing said photoresist pattern after said step of forming said hard pattern by dry etching.

3. The method of fabricating a semiconductor device according to claim 1, performing wet etching while leaving said photoresist pattern located in contact with the upper portion of said hard pattern intact in said step of forming said precision-made hard pattern by wet etching for thereafter dryly etching said base film through said precision-made hard pattern as a mask while leaving said photoresist pattern intact and removing said photoresist pattern along with said precision-made hard pattern by wet etching in said step of removing said precision-made hard pattern.

4. The method of fabricating a semiconductor device according to claim 1, wherein said hard film consists of a film containing at least one of titanium, titanium nitride, tungsten and tungsten nitride.

5. The method of fabricating a semiconductor device according to claim 1, wherein said base film is any of a silicon film, a silicon oxide film, a silicon nitride film, a silicon oxynitride film and a metal silicide film.

6. The method of fabricating a semiconductor device according to claim 1, employing a chemical solution containing an oxidant in at least either said step of removing said hard pattern by wet etching or said step of forming said precision-made hard pattern by wet etching.

7. The method of fabricating a semiconductor device according to claim 1, employing a chemical solution containing acid in at least either said step of removing said hard pattern by wet etching or said step of forming said precision-made hard pattern by wet etching.

8. The method of fabricating a semiconductor device according to claim 1, employing a chemical solution containing ammonia in at least either said step of removing said hard pattern by wet etching or said step of forming said precision-made hard pattern by wet etching.

9. The method of fabricating a semiconductor device according to claim 1, removing said hard pattern with at least one of a chemical solution containing hydrogen peroxide, a chemical solution containing ozone water, a chemical solution containing sulfuric acid, a chemical solution containing hydrochloric acid, a chemical solution containing phosphoric acid, a chemical solution containing nitric acid, a chemical solution containing acetic acid, a chemical solution containing hydrofluoric acid and a chemical solution containing ammonia in said step of removing said hard pattern by wet etching.

10. The method of fabricating a semiconductor device according to claim 1, performing wet etching with at least one of a chemical solution containing hydrogen peroxide, a chemical solution containing ozone water, a chemical solution containing sulfuric acid, a chemical solution containing hydrochloric acid, a chemical solution containing phosphoric acid, a chemical solution containing nitric acid, a chemical solution containing acetic acid, a chemical solution containing hydrofluoric acid and a chemical solution containing ammonia in said step of wetly etching said hard pattern for forming said precision-made hard pattern.

* * * * *